United States Patent
Hsiao et al.

(10) Patent No.: US 12,385,967 B2
(45) Date of Patent: Aug. 12, 2025

(54) WAFER TEST SYSTEM AND METHODS

(71) Applicant: Taiwan Semiconductor Manufacturing Co., Ltd., Hsinchu (TW)

(72) Inventors: Jyu-Hua Hsiao, Hsinchu (TW); Chun-Yu Lin, Hsinchu (TW); Chien Fang Huang, Hsinchu (TW); Kam Heng Lee, Hsinchu (TW); Jiun-Rong Pai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 167 days.

(21) Appl. No.: 18/505,781

(22) Filed: Nov. 9, 2023

(65) Prior Publication Data
US 2024/0369620 A1 Nov. 7, 2024

Related U.S. Application Data

(60) Provisional application No. 63/499,437, filed on May 1, 2023.

(51) Int. Cl.
*G01R 31/28* (2006.01)
(52) U.S. Cl.
CPC ..... *G01R 31/2867* (2013.01); *G01R 31/2877* (2013.01); *G01R 31/2881* (2013.01)

(58) Field of Classification Search
CPC .............. G01R 1/07392; G01R 31/2889
See application file for complete search history.

(56) References Cited

U.S. PATENT DOCUMENTS

| | | | | |
|---|---|---|---|---|
| 2006/0076108 | A1* | 4/2006 | Holland | H01L 21/6831 118/724 |
| 2008/0315904 | A1* | 12/2008 | Ishii | G01R 31/2891 324/756.03 |
| 2014/0160270 | A1 | 6/2014 | Naito et al. | |
| 2020/0209279 | A1* | 7/2020 | Hsu | G01R 31/2862 |

FOREIGN PATENT DOCUMENTS

TW 201600946 A 1/2016

\* cited by examiner

*Primary Examiner* — Tung X Nguyen
(74) *Attorney, Agent, or Firm* — Seed Intellectual Property Law Group LLP

(57) ABSTRACT

A method includes: positioning a wafer in a first probe chamber of a first probe apparatus by a robot arm, the first probe apparatus being adjacent a transfer rail, the robot arm, in operation, moving along the transfer rail; testing the wafer by the first probe apparatus; following the testing, transferring the wafer to an environmental buffer attached to the first probe chamber; cooling the wafer in the environmental buffer; and following the cooling, transferring the wafer from the environmental buffer to a second probe chamber of a second probe apparatus by the robot arm, the second probe apparatus being adjacent the transfer rail and offset from the first probe apparatus.

20 Claims, 17 Drawing Sheets

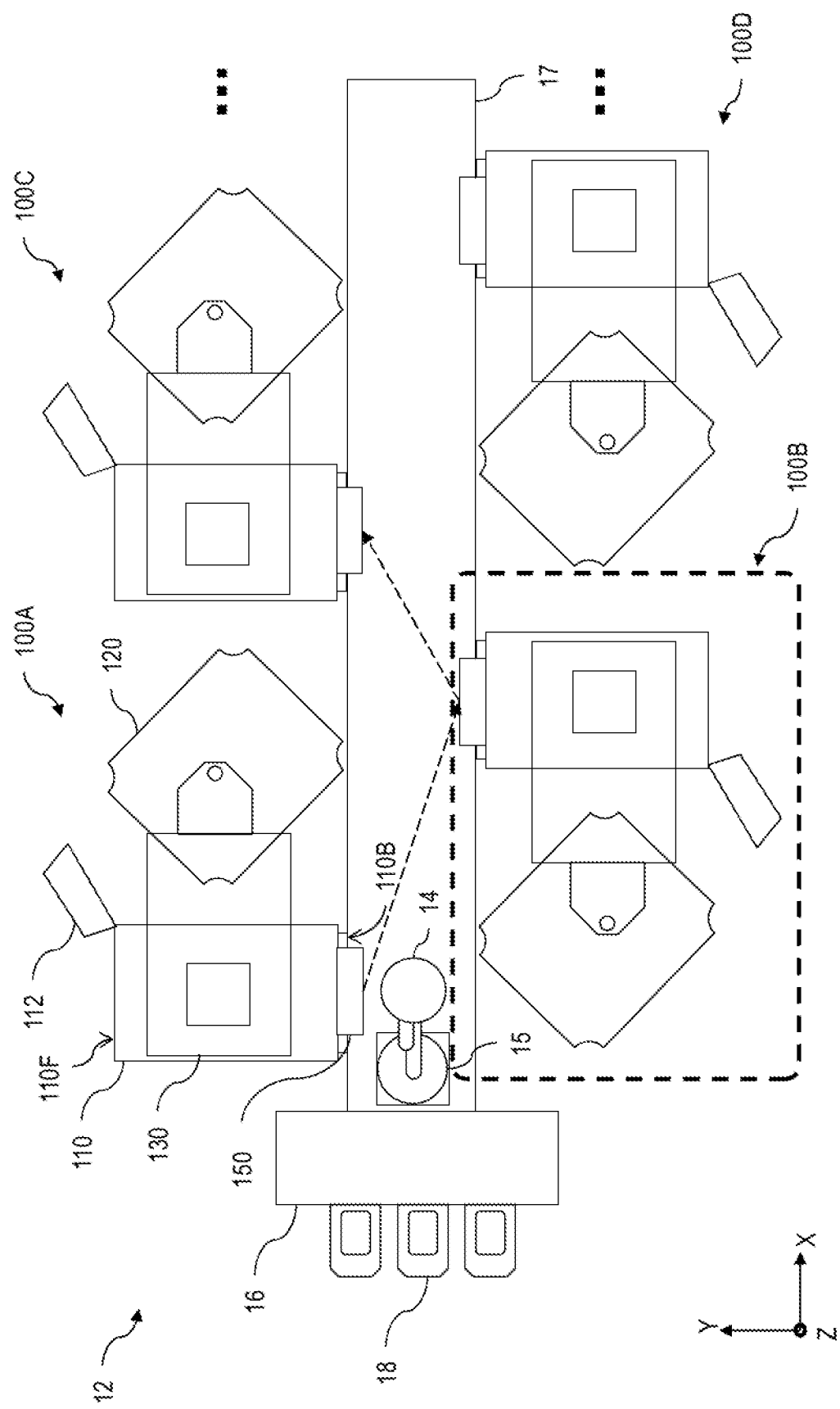

WAFER TEST SYSTEM AND METHODS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1D are views of a system for testing semiconductor wafers according to embodiments of the present disclosure.

FIGS. 2A-2K are views of an inspection apparatus according to various aspects of the present disclosure.

DETAILED DESCRIPTION

Figure 1A:
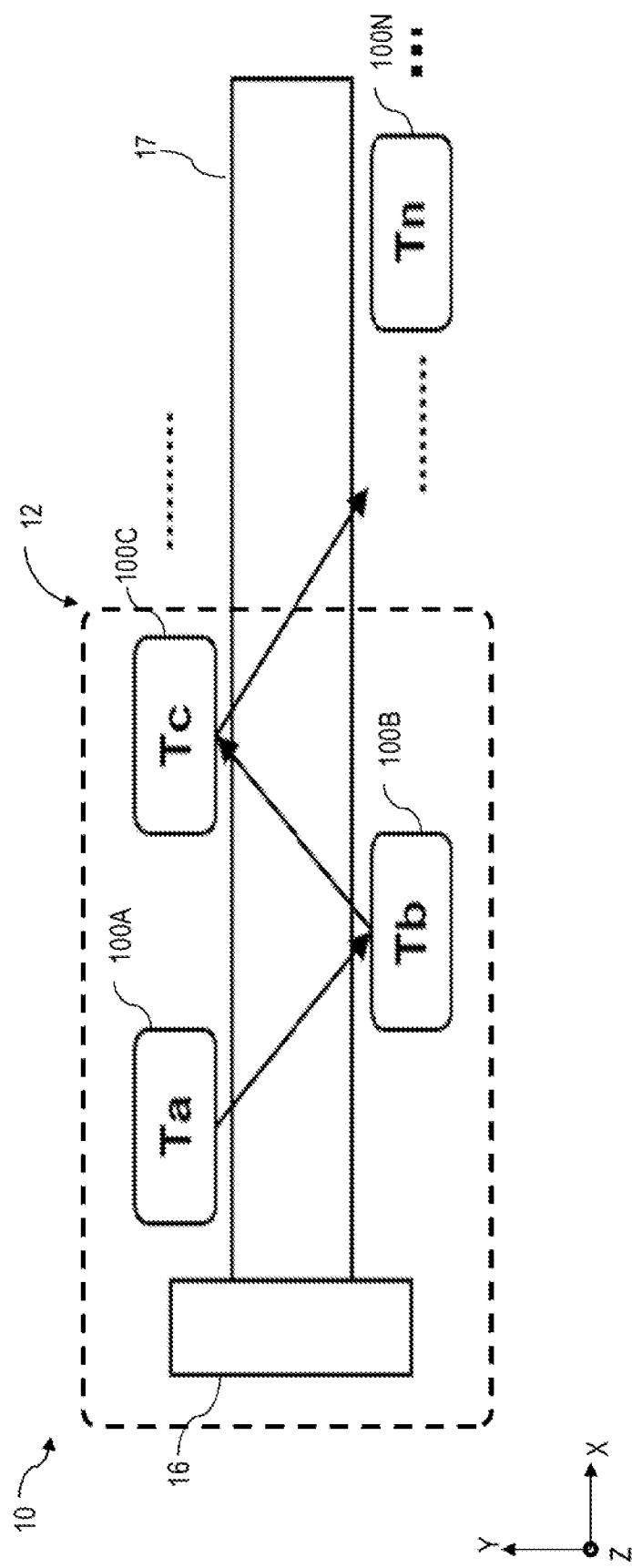

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms.

Semiconductor fabrication generally involves the formation of electronic circuits by performing multiple depositions, etchings, annealings, and/or implantations of material layers, whereby a stack structure including many semiconductor devices and interconnects between is formed. Following formation of the electronic circuits, a wafer testing process is performed. Generally, the finished wafer goes through multiple probe apparatuses under different testing temperatures, moisture levels and the like. For example, each test may be performed by a single probe apparatus (e.g., for one selected set of testing temperature, moisture level and the like). When multiple testing conditions are selected, such as different temperatures and/or moisture levels, multiple probe apparatuses are installed. The multiple probe apparatuses occupy a large space in a wafer fab and transferring the wafers from one probe apparatus to the next probe apparatus is time consuming.

In a method according to various embodiments, novel devices and structures support a multi-stage probe system. Wafers are loaded into each probe chamber from the backside of the probe apparatus. A loader is added behind a load port. Multiple probe apparatus chambers are arranged in a staggered or parallel manner along a transfer rail. Each probe apparatus chamber has a temperature and humidity buffer attached thereto. A novel transfer system is beneficial to integrate multiple testing stages in one system. In some embodiments, footprint of a test system may be reduced by up to or exceeding 13%. Transfer cycle time is reduced, which is beneficial to improve productivity. Dew and moisture are removed from the wafer by the temperature and humidity buffer, which improves testing results.

Figure 1C:
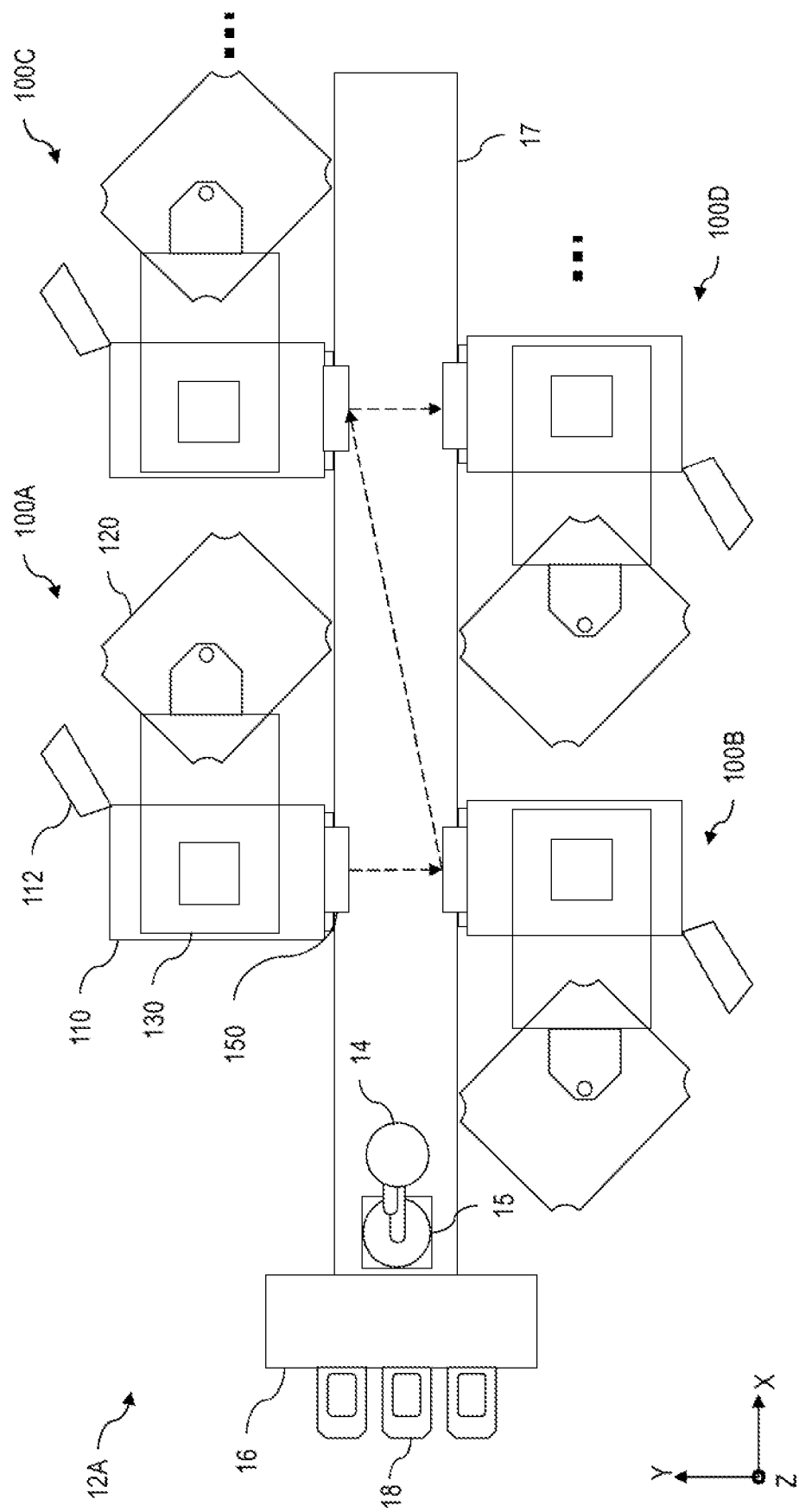
Figure 1D:
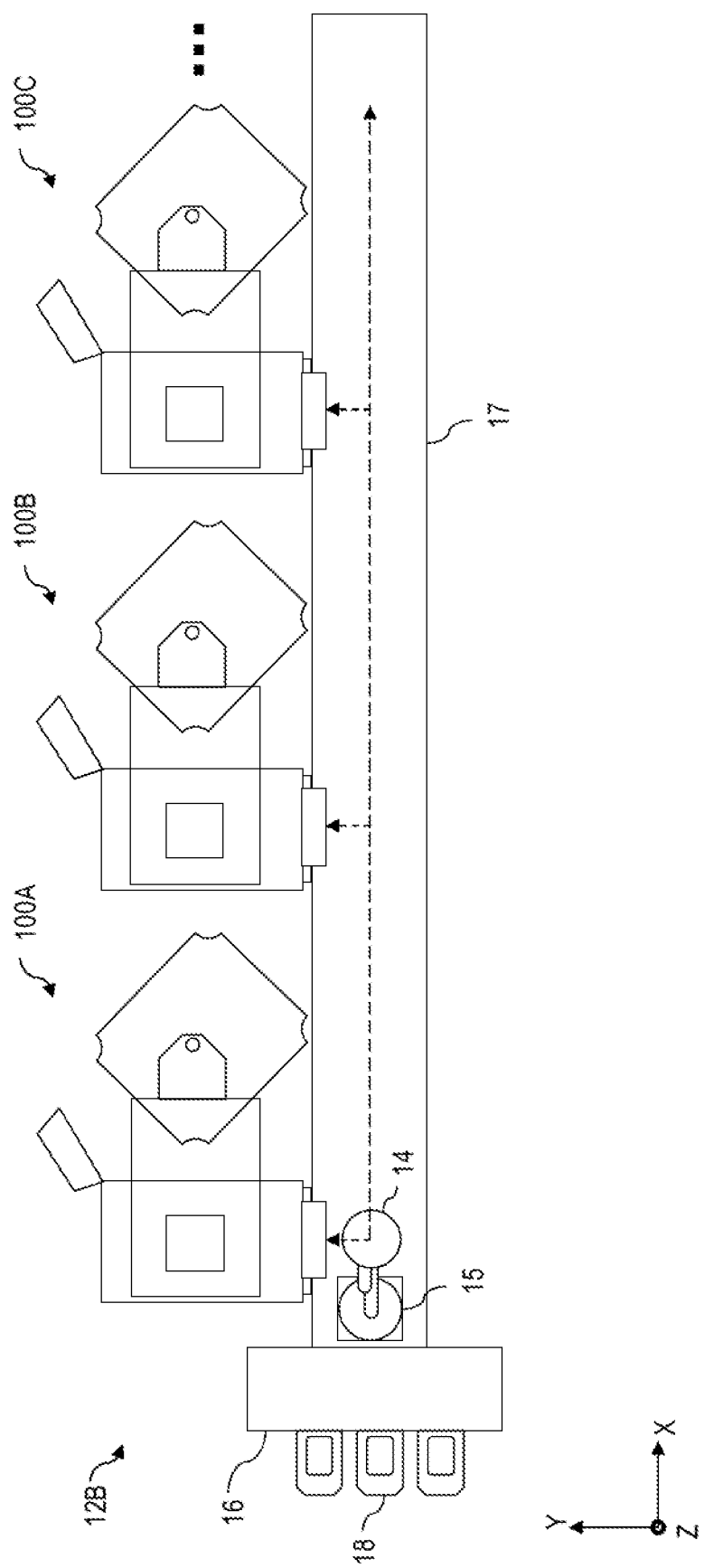

FIGS. 1A-1D are views of a system 10 for testing semiconductor wafers according to embodiments of the present disclosure. FIG. 1A is a diagrammatic top view of the system 10 in accordance with various embodiments. FIG. 1B is a diagrammatic partial view of a portion 12 of the system 10 having staggered arrangement in accordance with various embodiments. FIG. 1C is another diagrammatic partial view of a portion 12A having parallel arrangement in accordance with various embodiments. FIG. 1D is another diagrammatic partial view of a portion 12B having one-sided arrangement in accordance with various embodiments.

In FIG. 1A, the system 10 includes probe apparatuses 100A, 100B, 100C, . . . , 100N arranged along a transfer apparatus 17. The probe apparatuses 100A, 100B, 100C, . . . , 100N may be referred to collectively as the probe apparatuses 100. As depicted by arrows in FIG. 1A, a wafer may proceed along the transfer apparatus 17 to be tested by one or more of the probe apparatuses 100 in sequence. A load apparatus or "loader" 16 is positioned at a front end of the transfer apparatus 17. More detailed description of the system 10 is provided in the following with reference to a portion 12 of the system 10 depicted in various embodiments in FIGS. 1B-1D.

The probe apparatuses 100 may be arranged in a staggered arrangement as depicted in FIG. 1A. Namely, load ports thereof may be offset from each other along the X-axis direction. An embodiment in which the probe apparatuses 100 are arranged in a "parallel" arrangement is depicted in FIG. 1C, and described in more detail with reference thereto below.

Each of the probe apparatuses 100 may have a different chamber temperature. For example, the probe apparatus 100A may have a chamber temperature Ta, the probe apparatus 100B may have a chamber temperature Tb, and so on.

The chamber temperatures Ta, Tb, Tc, . . . . Tn may be different from each other. In some embodiments, one or more of the chamber temperatures Ta, Tb, Tc, . . . . Tn is the same as another of the chamber temperatures Ta, Tb, Tc, . . . . Tn. For example, in addition to having different chamber temperatures, each of the probe apparatuses 100 may have a different chamber humidity, chamber pressure or other environmental test condition. As such, two or more the probe apparatuses 100 may have the same chamber temperature, chamber humidity, chamber pressure or the like, while having at least one environmental test condition that is different from each other.

In FIG. 1B, the transfer apparatus 17 extends along a first horizontal direction (e.g., an X-axis direction, as depicted) and the probe apparatuses 100 are arranged on either side of the transfer apparatus 17, such that the transfer apparatus 17 passes between the probe apparatuses 100 on either side thereof. In some embodiments, the transfer apparatus 17 is a transfer rail, and may be referred to as the transfer rail 17.

A wafer 14 is depicted in FIG. 1B. The wafer 14 may be or include a semiconductor device. The semiconductor device may be any semiconductor device, such as, but not limited to, a logic device, a memory device or any other semiconductor device. The semiconductor device generally includes a semiconductor device layer, a frontside interconnection structure, an optional backside interconnection structure and one or more electrical contacts. In most embodiments, the wafer 14 is a semiconductor wafer that has multiple integrated circuit (IC) chips or dies formed therein. The semiconductor device layer may include a semiconductor substrate, which may be referred to as the substrate. The substrate may be any suitable substrate. In some embodiments, the substrate may be a semiconductor wafer. In some embodiments, the substrate may be a monocrystalline silicon (Si) wafer, an amorphous Si wafer, a gallium arsenide (GaAs) wafer, or any other semiconductor wafer.

The semiconductor device layer includes one or more semiconductor devices. The semiconductor devices included within the semiconductor device layer may be any semiconductor devices in various embodiments. In some embodiments, the semiconductor device layer includes one or more transistors, which may include any suitable transistor structures, including, for example, planar transistors, fin-type transistors (FinFETs), or nanostructure transistors, such as gate-all-around (GAA) transistors, or the like. In some embodiments, the semiconductor device layer includes one or more GAA transistors. In some embodiments, the semiconductor device layer may be a logic layer that includes one or more semiconductor devices, and may further include their interconnection structures, that are configured and arranged to provide a logical function, such as AND, OR, XOR, XNOR, or NOT, or a storage function, such as a flipflop or a latch. In some embodiments, the semiconductor device layer may include a memory device, which may be any suitable memory device, such as, for example, a static random access memory (SRAM) device. The memory device may include a plurality of memory cells that are constructed in rows and columns, although other embodiments are not limited to this arrangement. Each memory cell may include multiple transistors (e.g., six) connected between a first voltage source (e.g., VDD) and a second voltage source (e.g., VSS or ground) such that one of two storage nodes can be occupied by the information to be stored, with the complementary information stored at the other storage node. The semiconductor device layer of the device may further include various circuitry that is electrically coupled to the semiconductor device layer. For example, the semiconductor device layer may include power management or other circuitry that is electrically coupled to the one or more semiconductor devices of the semiconductor device layer. The power management circuitry may include any suitable circuitry for controlling or otherwise managing communication signals, such as input power signals, to or from the semiconductor devices of the semiconductor device layer. In some embodiments, the power management circuitry may include power-gating circuitry which may reduce power consumption, for example, by shutting off the current to blocks of the circuit (e.g., blocks or electrical features in the semiconductor device layer) that are not in use, thereby reducing stand-by or leakage power. In some embodiments, the semiconductor device layer includes one or more switching devices, such as a plurality of transistors, that are used to transmit or receive electrical signals to and from the semiconductor devices in the semiconductor device layer, such as to turn on and turn off the circuitry (e.g., transistors, etc.) of the semiconductor device layer.

A wafer carrying and transfer assembly 15 is depicted in FIG. 1B. The system 10 may include the wafer carrying and transfer assembly 15, which may be a robot arm, and may be referred to as the robot arm 15. The robot arm 15 is configured to carry the wafer 14, to place the wafer 14 in the respective probe apparatus 100 and to pick the wafer 14 from the respective probe apparatus 100 and from the load apparatus 16. The robot arm 15 may be configured to rotate and translate in any of X-axis, Y-axis and Z-axis directions (the Z-axis direction is orthogonal to the XY plane depicted in FIGS. 1A-1D). The robot arm 15 is further configured to move along the transfer rail 17, for example, in both positive and negative X-axis directions. A single robot arm 15 is depicted in FIGS. 1B-1D. In some embodiments, two or more robot arms 15 are included in the system 10 and may be arranged along the transfer rail 17.

Three load ports 18 are depicted in FIG. 1B. The system 10 may include one or more load ports 18, such as the three load ports 18 depicted. The load ports 18 are configured to receive wafers 14 from outside the system 10, such as via an overhead transport (OHT) system, and to place the wafers 14 in the load apparatus 16. The load ports 18 may be included in the load apparatus 16. The load ports 18 may each include a table for receiving a wafer carrier that carries the wafers 14. A door (not separately depicted) may be positioned between the table and an internal chamber of the load apparatus 16. After receiving the wafer carrier from the OHT system on the table of the load port 18, the door may be opened, and the wafers 14 may be transferred into the chamber of the load apparatus 16. For example, the load apparatus 16 may retrieve one of the wafers 14 at a time to transfer to the robot arm 15 based on a schedule or priority conditions.

The load apparatus 16 is depicted in FIG. 1B. The load apparatus 16 may include the load ports 18 and is configured to transfer individual wafers 14 from a wafer carrier positioned on the load port 18 to the robot arm 15. The load apparatus 16 may include a transfer assembly, such as a robot arm, which may be referred to as a load robot arm herein. The system 10 depicted in FIG. 1B may include a single load apparatus 16, as shown, or may include two or more load apparatuses 16. The load apparatus 16 is described in greater detail with reference to FIG. 2E.

The probe apparatuses 100A, 100B, 100C, 100D are depicted in FIG. 1B. Brief description of elements of the probe apparatuses 100 is provided here with reference to the probe apparatus 100A. The probe apparatuses 100B, 100C, 100D may be similar to or the same as the probe apparatus 100A. The probe apparatus 100A includes a probe chamber 110, a test head manipulator 120 (or "manipulator 120"), a test head 130 and an environmental buffer 150. It should be understood that, although four probe apparatuses 100A, 100B, 100C, 100D are depicted in FIG. 1B, with two on each side of the transfer rail 17, in some embodiments, three or more probe apparatuses may be arranged on either side of the transfer rail 17, as depicted in FIG. 1B using " . . . " markings. In another embodiment, a single probe apparatus may be present on either side of the transfer rail 17. For example, the probe apparatuses 100C, 100D may be omitted in some embodiments.

The probe chamber 110 includes a housing and a probe door 112. The probe chamber 110 may be configured to perform wafer handling, wafer holding (e.g., by a chuck), temperature, humidity and pressure regulation and monitoring, and the like. The probe door 112 provides access to an internal area or chamber of the probe chamber 110 and is arranged to be on a side of the probe chamber 110 that faces away from the transfer rail 17. The probe door 112 is generally considered to be on a "front" side 110F of the probe chamber 110. The front side 110F is accessible to human operators. A back side 110B of the probe chamber 110 (opposite the front side) faces the transfer rail 17. As such, loading of the wafer 14 (e.g., an 8-inch or 12-inch wafer) into the probe chamber 110 by the robot arm 15 is through the back side 110B of the probe chamber 110.

The manipulator 120 may be configured to move the test head 130 onto and away from the probe chamber 110. For example, the manipulator 120 may accurately position the test head 130 over the probe chamber 110. The manipulator 120 may provide proper alignment with the probe chamber 110, which is beneficial for reliable and repeatable testing. The manipulator 120 may be configured to move in multiple axes, such as X, Y, and Z, to achieve precise positioning and alignment. The manipulator 120 may be configured to hold the test head 130 securely during testing. The manipulator 120 may provide stability and prevent unintended movement or vibrations that could affect testing accuracy. The manipulator 120 may employ clamps, vacuum suction or other mechanisms to firmly hold the test head 130 in place. In some embodiments, the manipulator 120 may transfer different test heads 130 onto the probe chamber 110. The manipulator 120 may safely remove the current test head 130 and replace it with a different test head, which is beneficial for efficient switching between different tests or configurations. The manipulator 120 may be controlled by software that coordinates its movements with the system's 10 overall operation. The manipulator 120 may receive instructions from test system software or an equipment control system (ECS) and performs selected movements and positioning. The software may include selected sequences or routines for the manipulator 120 to follow during a test head exchange process.

The test head 130 is included in the system 10. The test head 130 may be configured as an interface and control assembly in testing of the wafer 14. The test head 130 may provide electrical connections, signal transmission, precise contact force application and test sequencing between testing equipment and the wafer 14 (or "device under test" or "DUT"). The test head 130 may provide electrical connections between the testing equipment and the DUT. For example, the test head 130 may include a set of probe pins or contacts that make contact with test pads or bond pads of the DUT. The probe pins establish electrical connections, allowing for the application of test signals and the measurement of electrical responses. The test head 130 may facilitate transmission of test signals between the testing equipment and the DUT, for example, ensuring that the electrical signals generated by the tester are accurately delivered to appropriate test points on the DUT. The test head 130 may also receive electrical responses from the DUT and transmit the electrical responses back to the testing equipment for analysis and measurement. The test head 130 may hold and support a probe card, which contains probe needles or microprobes that make contact with the DUT. The probe card may be mounted on a mechanism that allows for precise positioning and alignment with the DUT's test pads. The test head 130 may provide secure mounting and proper alignment of the probe card for reliable testing. In some embodiments, the test head 130 applies a controlled and consistent contact force between the probe pins and the DUT's test pads. The contact force ensures reliable electrical contact and reduces the risk of signal distortion or measurement errors. The test head 130 may have sub-assemblies that are configured to adjust and regulate the contact force based on selected testing parameters. Generally, because the test head 130 is very heavy, the test head 130 may be positioned in a fixed manner over the probe chamber 110 and the chuck 218 carrying the wafer 14 may move the wafer 14 up to contact the probe card 290 to perform testing. The test head 130 may coordinate and control sequencing of tests performed on the DUT. During testing, the test head 130 may generate heat due to the electrical signals and power being applied to the DUT. As such, the test head 130 may include cooling structures that dissipate heat and maintain temperature within selected thresholds.

The optional environmental buffer 150 is included in the system 10 and is connected to the back side 110B of the probe chamber 110. The environmental buffer 150 is operable to maintain and regulate temperature and humidity therein, so as to dehumidify and/or cool down the wafer 14 after unloading from the probe chamber 110. The wafer 14 may be placed in the environmental buffer 150 following testing thereof in the probe chamber 110 for dehumidification and/or cooling down/warming up the wafer 14 to room temperature without generating liquid condensation (e.g., dew) on the wafer 14. For example, when the wafer 14 is tested at high temperature, the wafer 14 is cooled down in the environmental buffer 150. In another example, when the wafer 14 is tested at low temperature, when placed in environmental buffer 150, it takes time for the wafer 14 to warm up to room temperature. The flowing gas is beneficial to increase temperature of the wafer 14 from the low temperature, and also to reduce humidity so that dew accumulation on the wafer 14 is reduced.

In FIG. 1B, the probe apparatuses 100 are arranged in a staggered arrangement, such that back sides of the probe apparatuses 100 that are opposite each other are out of alignment and/or do not overlap. Namely, entrance to the probe apparatuses 100 from the transfer rail 17 side is overlapping for two probe apparatuses 100 on opposite sides of transfer rail 17.

FIG. 1C depicts an arrangement in which probe apparatuses 100A, 100B, 100C, 100D are in a parallel arrangement. The arrangement is depicted as a portion 12A of the system 10, which may be a partial portion of the system 10 of FIG. 1A. As depicted, the entrance to the probe apparatus 100A is opposite and overlaps (or is aligned with) the entrance to the probe apparatus 100B. The entrance to the probe apparatus 100C is opposite and overlaps (or is aligned with) the entrance to the probe apparatus 100D. Such an arrangement may be beneficial to reduce travel distance and time for the wafer 14 as it is moved between the probe apparatuses 100.

FIGS. 1A-1C depict arrangements in which probe apparatuses 100 are positioned on both sides of the transfer rail 17.

FIG. 1D depicts an arrangement in which the probe apparatuses 100 are positioned on a single side of the transfer rail 17, with the opposing side of the transfer rail 17 being free of probe apparatuses. The arrangement is depicted as a portion 12B of the system 10, which may be a partial portion of the system 10 of FIG. 1A. Relative to the page, the probe apparatuses 100 are positioned on the "top" side of the transfer rail 17. Namely, the probe chamber 110 of the probe apparatus 100A may be nearer the load apparatus 16 than the manipulator 120 thereof when positioned on the top side, as depicted in FIG. 1D. In some embodiments, the probe apparatuses 100 may be positioned at the "bottom" side of the transfer rail 17. When arranged on the bottom side, the manipulator 120 of the probe apparatus 100A may be nearer the load apparatus 16 than the probe chamber 110, similar to the arrangement of the probe apparatus 100B depicted in FIGS. 1B and 1C.

FIGS. 2A-2K are detailed views of a probe apparatus 200 in accordance with various embodiments. The probe apparatus 200 is similar in many respects to the probe apparatuses 100 described with reference to FIGS. 1A-1D. Description of the probe apparatus 200 provides additional context for understanding the processes of FIGS. 3 and 4, as well as attendant benefits of the system 10 described with reference to FIGS. 1A-1D.

Figure 2A:
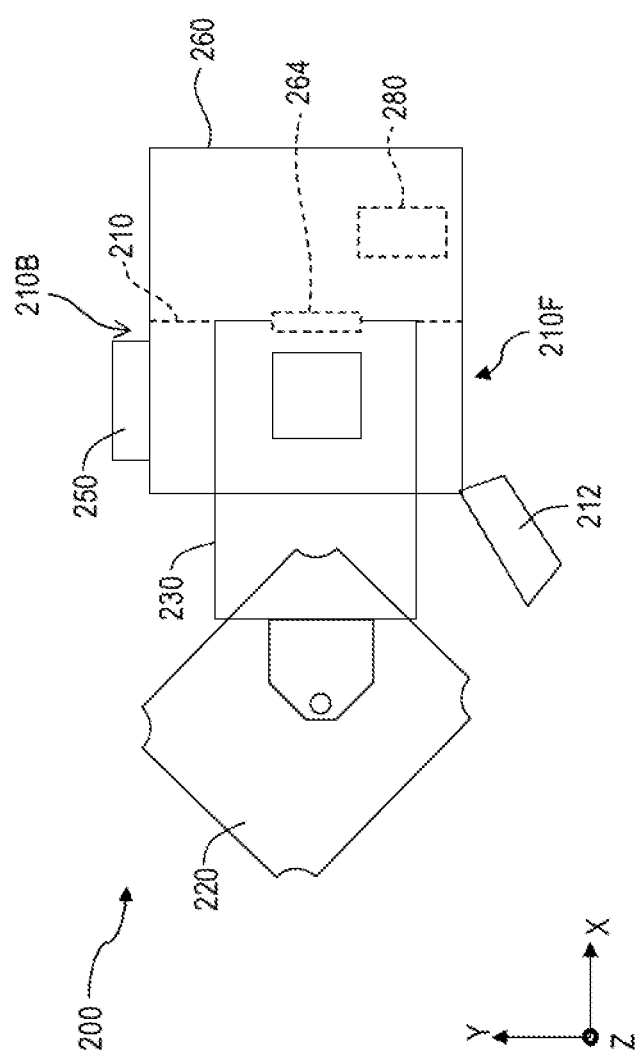
Figure 2B:
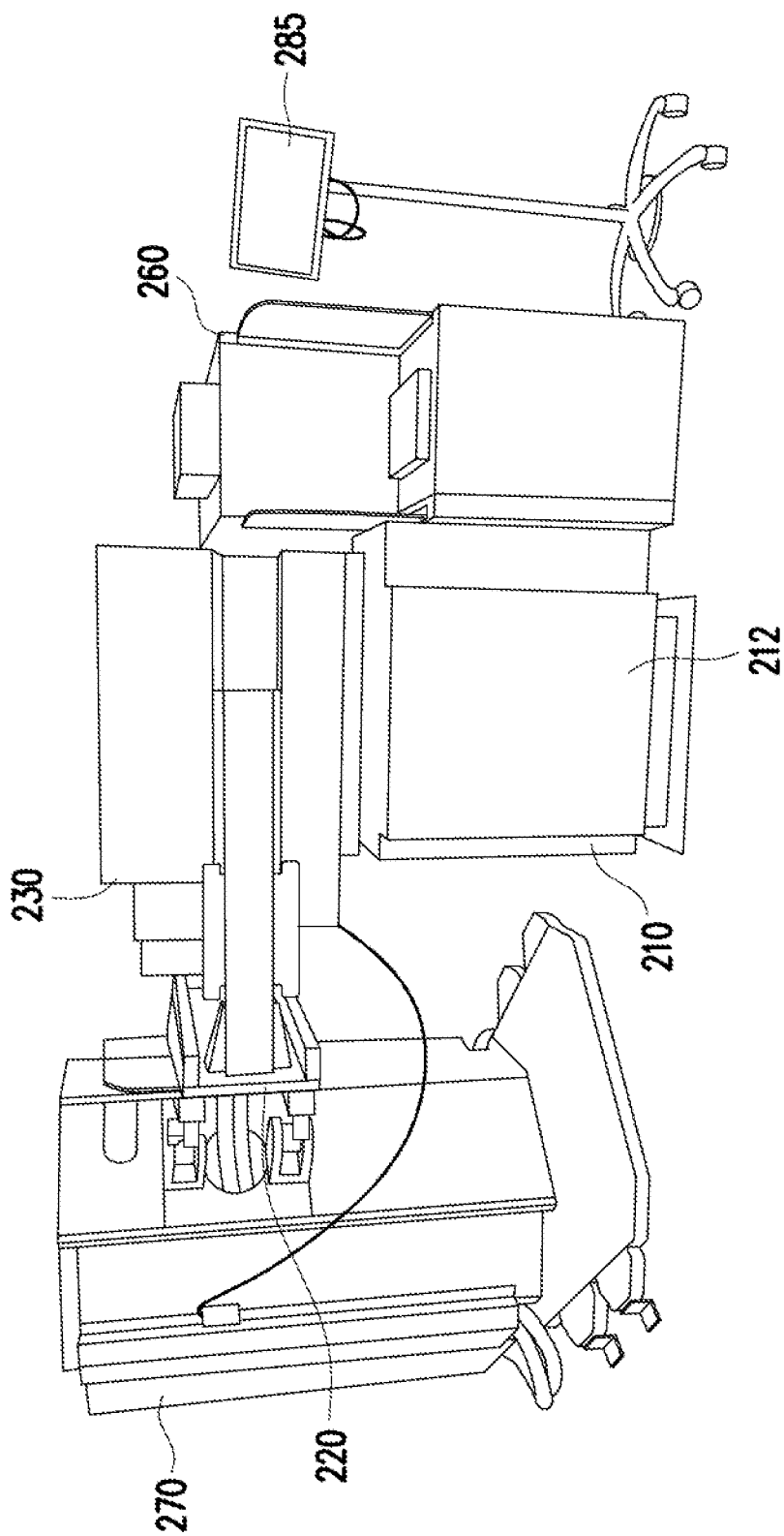

FIG. 2A is a schematic view of the probe apparatus 200. FIG. 2B is a perspective view of the probe apparatus 200. The probe apparatus 200 includes a probe chamber 210, a manipulator 220, a test head 230, an environmental buffer 250 and a load apparatus or loader 260, which may be embodiments of and/or similar to the probe chamber 110, the manipulator 120, the test head 130, the environmental buffer 150 and the loader 16. As depicted in FIG. 2B, the manipulator 220 is holding the test head 230 over the probe chamber 210. The load apparatus 260 is adjacent and connected to the probe chamber 210. FIG. 2B also depicts a test support cabinet 270 and a user interface terminal 285. In some embodiments, the probe apparatus 200 includes the probe chamber 210, the loader 260 and the user interface terminal 285, and the test support cabinet 270, the manipulator 220 and the test head 230 are included in a test apparatus that is separate from the probe apparatus 200, as depicted by dashed lines in FIG. 2B.

In FIG. 2A, the loader 260 and load port 280 are depicted by dashed lines, as the loader 260 is not present as part of the probe apparatus 200 when configured for use with the transfer rail 17 and the robot arm 15 as described with reference to FIGS. 1A-1D. In the configuration depicted in FIG. 2A, for example, in a configuration in which the probe apparatus 200 is used in a standalone arrangement, the loader 260 may be adjacent and connected to the probe chamber 210 to facilitate loading of wafers 14 into the probe chamber 210 via a door or opening 264 in a side of the probe chamber 210. The load port 280 of the probe chamber 210 (similar to the load ports 18) is positioned on a same side (e.g., a front side 210F) of the probe chamber 210 as a probe door 212 thereof. The probe door 212 may be similar to the probe door 112. As such, a wafer carrier may be positioned on the load port 280, the wafers 14 therein may be loaded into the probe chamber 210 via the loader 260 and the door 264, and a human operator may access the interior of the probe chamber 210 via the probe door 212.

When multiple probe apparatuses 200 are used to perform multiple test operations under different test conditions, each probe apparatus 200 may have its own loader 260. This may occupy a large space on a floor of a semiconductor fab. In the configuration depicted in FIGS. 1A-1D, a single load chamber 16 with multiple load ports 18 may be positioned at a front end of the transfer rail 17, and the robot arm 15 may operate to deliver the wafer 14 to each probe chamber 210 via the back side 210B thereof. Each of the probe apparatuses 200 may then be free of a load apparatus 260. Sharing the load apparatus 16, 260 between multiple probe apparatuses 100, 200 is beneficial to reduce footprint of the system 10 including multiple probe apparatuses 100 (or probe apparatuses 200). For example, the inventors have found that footprint of the system 10 may be reduced by as much as 13% or more using the configuration depicted in FIGS. 1A-1D.

Another advantage of the system 10 described with reference to FIGS. 1A-1D is that transfer of wafers 14 from one probe apparatus 100, 200 to another is much faster. For example, in the probe apparatus 200 depicted in FIGS. 2A, 2B, all wafers 14 of a wafer carrier may be tested. Then, the wafer carrier may be transferred by the OHT to another load port of another probe apparatus for further testing. However, in the system 10 described with reference to FIGS. 1A-1D, after a wafer 14 completes one test at the probe apparatus 100A, the wafer 14 may be cooled, then moved to the probe apparatus 100B for another test immediately via the robot arm 15 and the transfer rail 17. While the wafer 14 undergoes the another test at the probe apparatus 100B, another wafer may be tested in the probe apparatus 100A. This is beneficial to reduce transfer cycle time and improve productivity.

FIGS. 2C-2J are diagrammatic perspective and plan views of elements of the probe apparatuses 100, 200 in accordance with various embodiments.

Figure 2C:
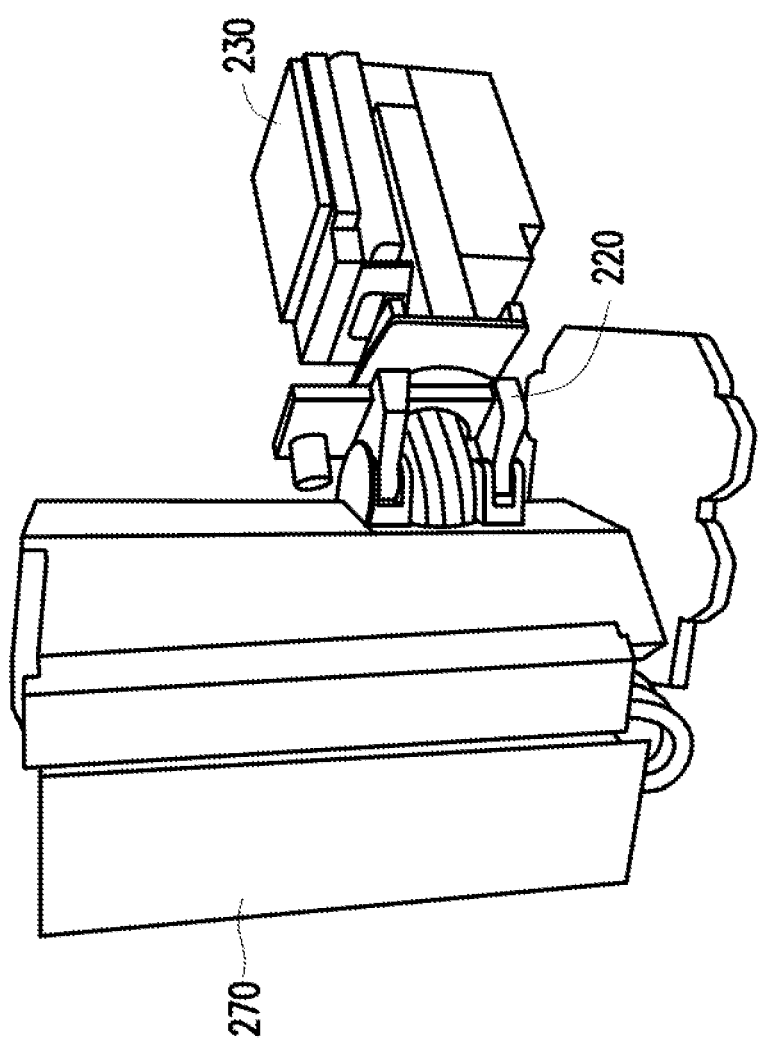

FIG. 2C depicts the test support cabinet 270, the manipulator 220 and the test head 230. The manipulator 220 may be connected to the test support cabinet 270 and may be operable to hold, translate and rotate the test head 230.

The test support cabinet 270 may be or include a system monitor and/or controller. For example, the test support cabinet 270 may house circuit boards and/or ICs that monitor and/or control various aspects of a test procedure performed using the test head 230. The test support cabinet 270 may include test instruments, such as signal generators, power supplies, digital signal processors and the like for generating test signals, measuring electrical responses and performing various measurements during a test procedure. Generally, the test instruments are installed in the test head 230. The test support cabinet 270 may include hardware interfaces, such as high-speed digital interfaces, analog interfaces and communication interfaces (e.g., Ethernet, USB, and the like) for connecting with the test head 230, probe chamber 210, manipulator 220 and the like. The test support cabinet 270 may include cooling and ventilation systems (e.g., air cooling and liquid cooling), power distribution systems, data storage and management systems, safety features, rack and cable management, monitoring and control interfaces, environmental control systems, and the like.

Figure 2D:
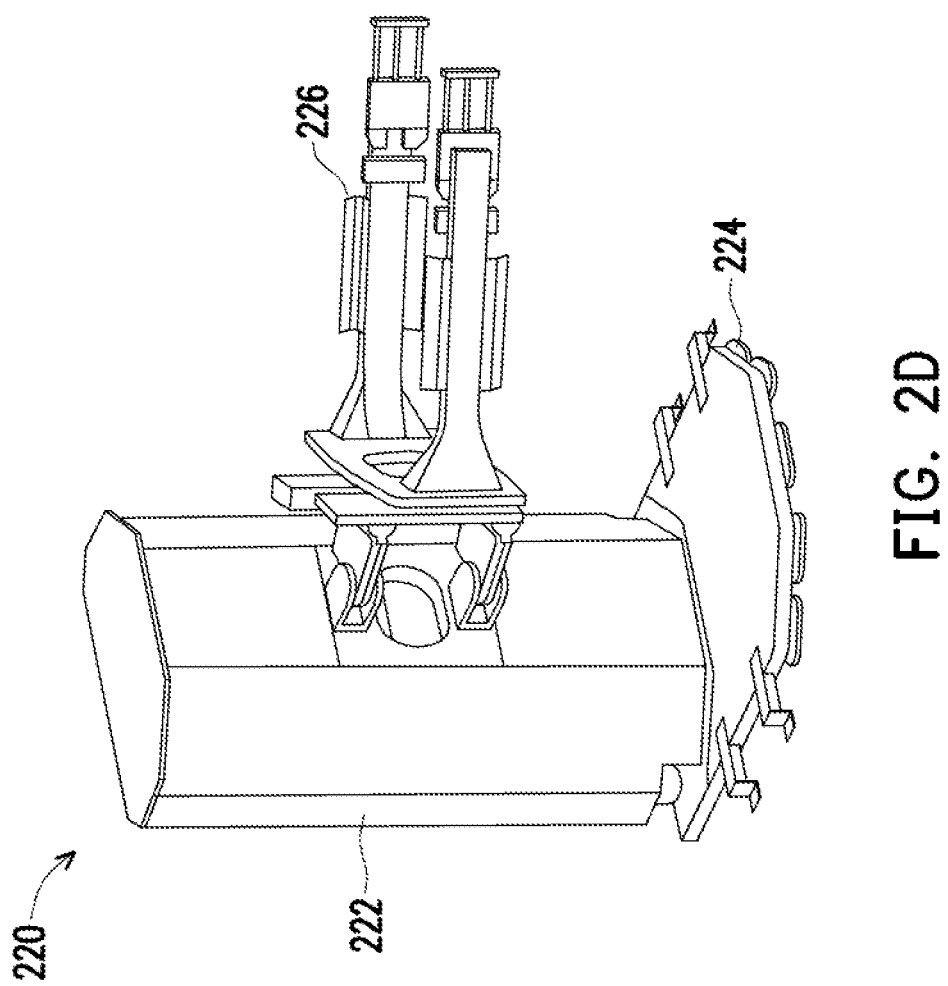

The manipulator 220 is depicted in detail in FIG. 2D. The manipulator 220 may be connected to the test support cabinet 270, and includes a base 224, a body 222 and arms 226. The manipulator 220 may be operable to translate and/or rotate the test head 230. For example, the manipulator 220 may perform upward and downward movement of the test head 230 as well as rotation of the test head 230. The manipulator 220 may include a counterbalance system and a cooling system, such as an air cooling system.

The test head 230 may be similar to the test head 130 described with reference to FIG. 1B, and the same description applies. The test head 230 may include testing instruments and a docking system, and may be operable to hold a probe card.

Figure 2E:
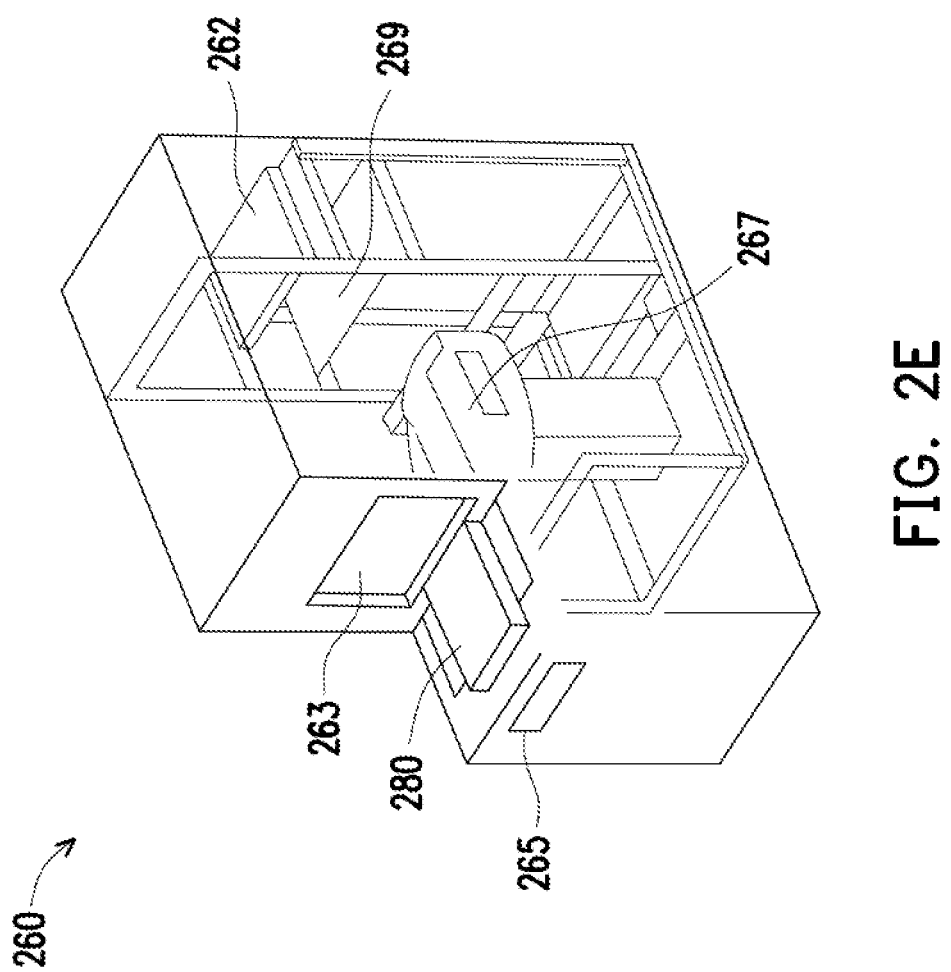

FIG. 2E is a diagrammatic perspective view of the load apparatus 260 in accordance with various embodiments. The load apparatus 260 may include a wafer table 265, the load port 280, a door or FOUP opener 263, a robot arm 267, a chuck or subchuck 269 and a buffer table 262.

Figure 2F:
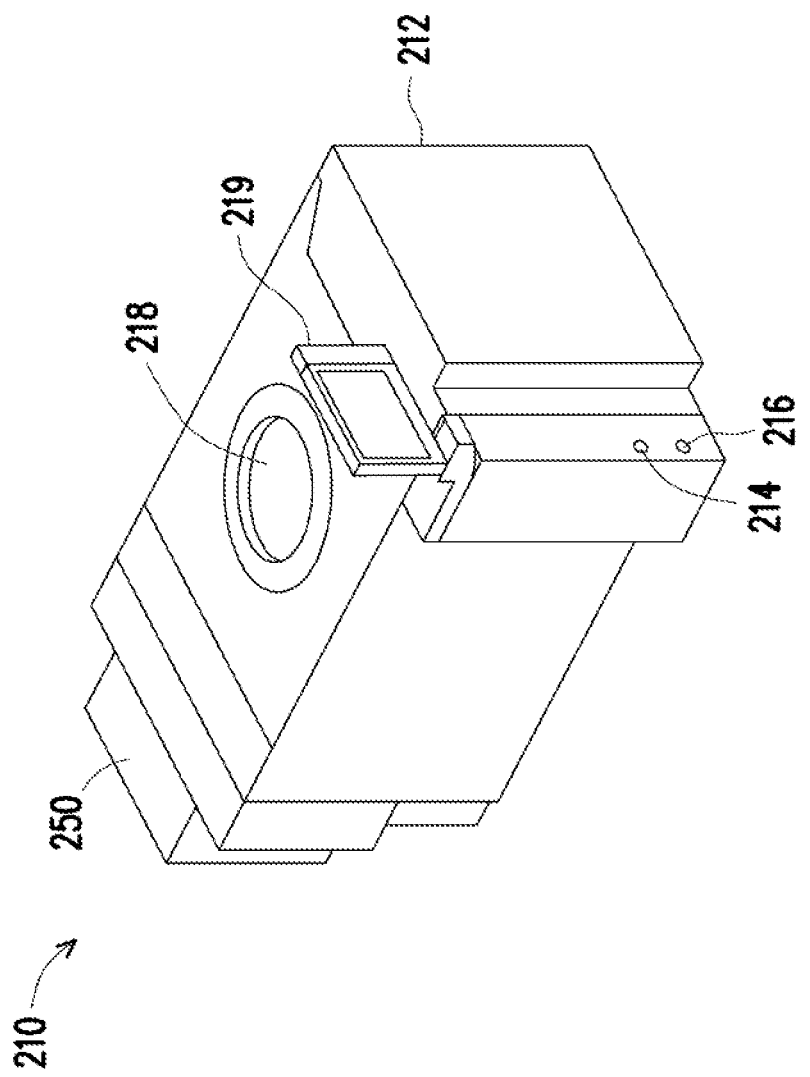
Figure 2G:
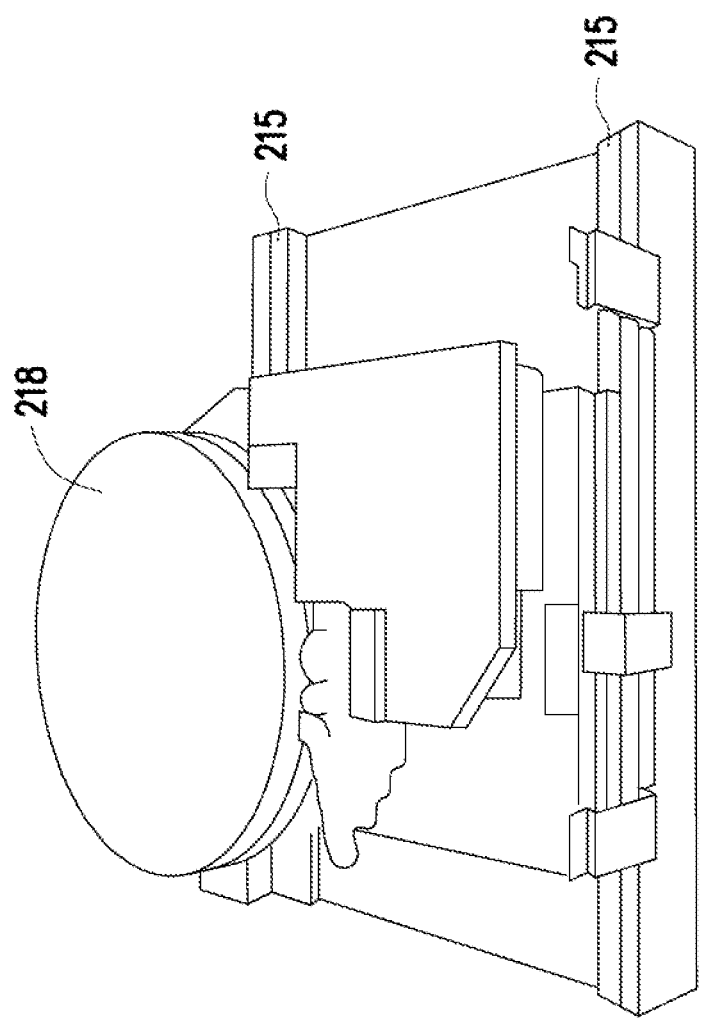

FIGS. 2F and 2G are diagrammatic perspective views of the probe chamber 210 in accordance with various embodiments. The probe chamber 210 may include the probe door 212 as described with reference to FIGS. 1B and 2A. The probe chamber 210 may further include an air pressure gauge 214, a vacuum gauge 216, the environmental buffer 250, a user interface terminal 219 and a chuck 218. The probe door 212 is on a same side of the probe chamber 210 as the user interface terminal 219, the air pressure gauge 214 and the vacuum gauge 216. The environmental buffer 250 is the same as or similar to the environmental buffer 150 described with reference to FIGS. 1A-1D. The environmental buffer 250 is located on an opposite side of the probe chamber 210 as the probe door 212. Namely, the environmental buffer 250 may be attached to a wafer entrance of the process chamber 210. This is advantageous to allow wafers to cool in the environmental buffer 250 near the transfer rail, so that the robot arm may pick the wafers from the environmental buffer 250 once cooling is complete. Similarly, having the gauges 214, 216, the probe door 212 and the user interface terminal 219 facing away from the transfer rail is beneficial for a human operator to view and/or operate these components without obstruction from the transfer rail. In some embodiments, each probe apparatus 200 may include two or more environmental buffers 250.

FIG. 2G is a diagrammatic perspective view of the chuck 218 in accordance with various embodiments. In some embodiments, the chuck 218 is positioned on guide rails 215. The chuck 218 may be an electrostatic chuck. The guide rails 215 may provide a stable and controlled path for the chuck's 218 movement. By sliding along the guide rails 215, the chuck 218 may achieve high positioning accuracy, which is beneficial for precise alignment of probes with test pads on the wafer 24. The guide rails 215 may also allow the chuck 218 to traverse an entire probing area, which is beneficial to covering a larger testing area on the wafer 24 surface. This increased coverage is beneficial when testing multiple test structures or when conducting probing on different regions of a wafer. It allows for efficient testing of multiple devices or circuits without the need for manual repositioning of the wafer.

Figure 2H:
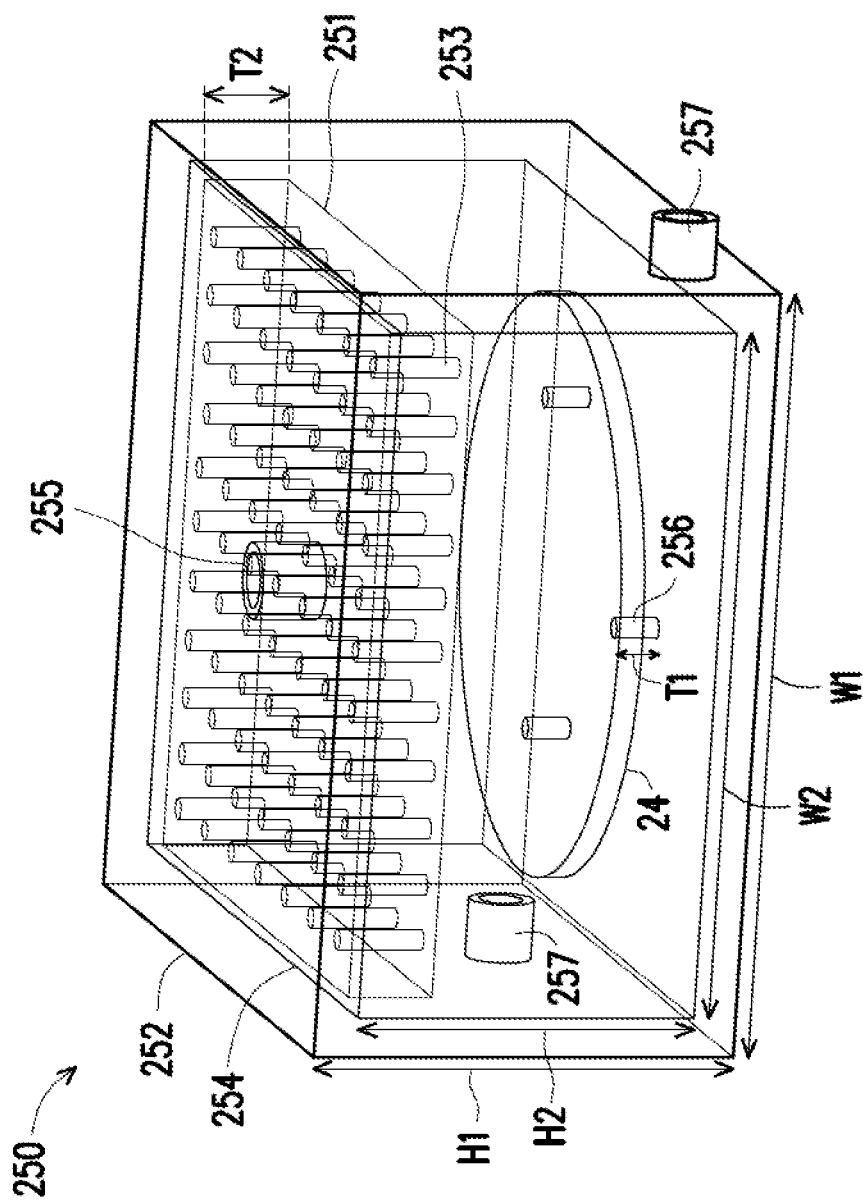
Figure 21:
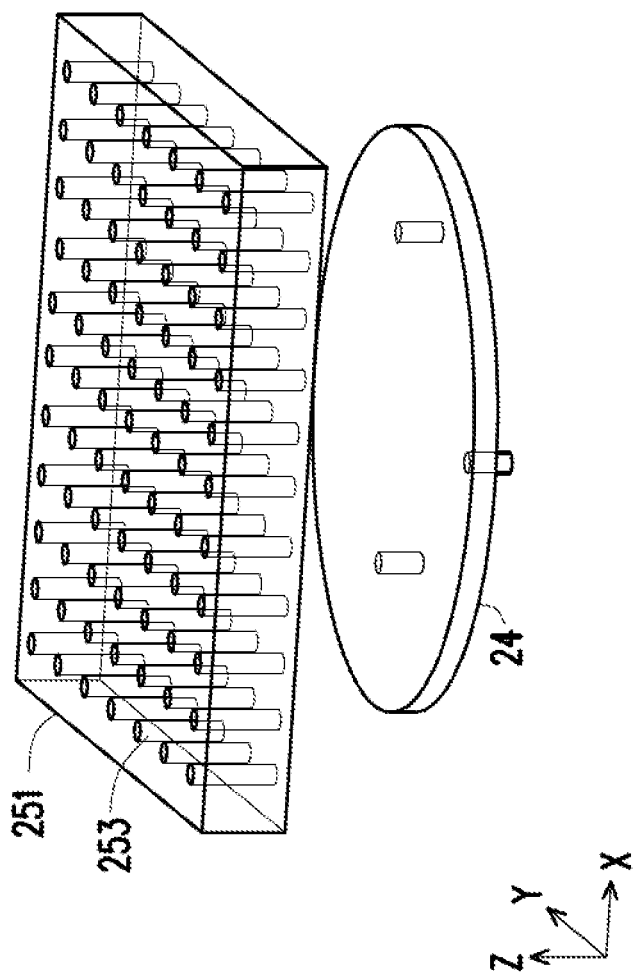
Figure 2J:
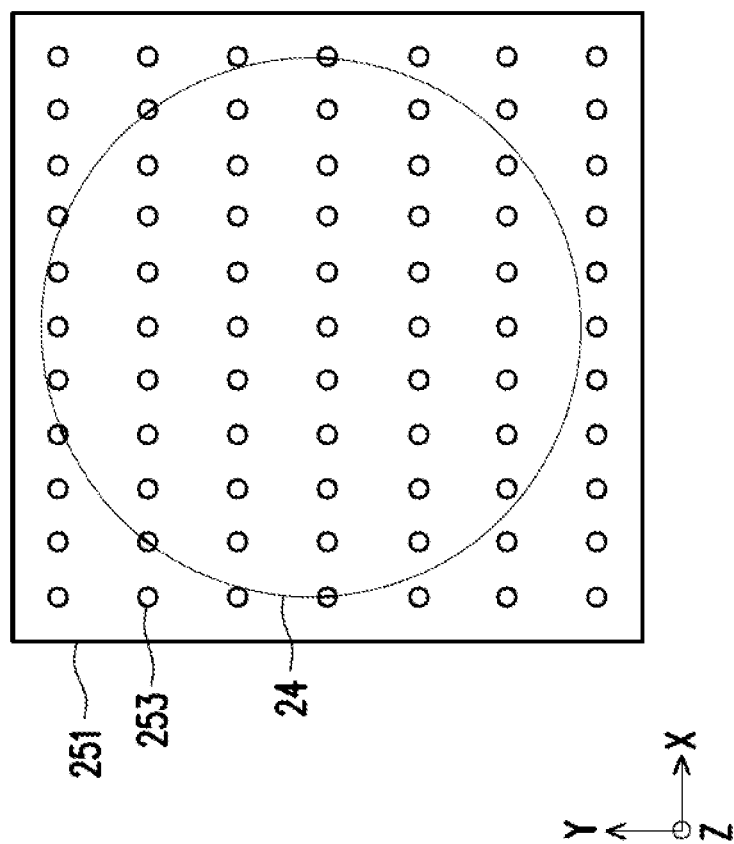

FIGS. 2H-2J are diagrammatic perspective and plan views of the environmental buffer 250 in accordance with various embodiments. FIG. 2H is a diagrammatic perspective view of the environmental buffer 250 having a wafer 24 positioned therein. FIG. 2I is a partial view depicting a shower plate 251 of the environmental buffer 250 over the wafer 24. FIG. 2J is a plan view of the shower plate 251 and the wafer 24.

In FIG. 2H, the environmental buffer 250, which may be a temperature and humidity buffer 250, includes a housing 252, a chamber 254, a shower plate 251 in the chamber 254, an upper air inlet 255, one or more air exhaust ports 257 and standoffs or lift pins 256. Before the wafer 24 is unloaded from the probe chamber 210 onto the transfer rail 17, the wafer 24 may be placed in the environmental buffer 250 for dehumidification and/or cooling down/warming up the wafer 24 to room temperature. Dew point temperature within the chamber 254 may be controlled to be less than about -50 degrees Celsius.

The housing 252 has a first width W1 and a first height H1. The chamber 254 has a second width W2 and a second height H2. The lift pins 256 have a third height T1. The shower plate 251 has a fourth height T2. The first width W1 exceeds the second width W2, which exceeds width of the wafer 24. In some embodiments, the wafer 24 is 12 inches wide, and the second width W2 exceeds 12 inches. In some embodiments, the second height H2 exceeds thickness of the wafer 24 plus the third height T1 of the lift pins 256 plus the fourth height T2 of the shower plate 251 plus at least about 15 millimeters.

Although not specifically depicted in FIG. 2H, the environmental buffer 250 may include one or more doors that allow access to the chamber 254 and sealing of the chamber 254. For example, the environmental buffer 250 may include a first door that faces the transfer rail 17, such that the robot arm 15 may place the wafer 24 on the standoffs 256 in the chamber 254 and/or may pick the wafer 24 from off the standoffs 256. When the wafer 24 is positioned in the chamber 254 and being cooled and/or dehumidified, the door that faces the transfer rail 17 may be closed or shut. A second door of the environmental buffer 250 may face the probe chamber 210 of the probe apparatus 200. Following test of the wafer 24 in the probe apparatus 200, the second door may open, such that the wafer 24 may be moved from the probe chamber 210 to the chamber 254 for cooling and/or dehumidification. In some embodiments, the second door is omitted, and the housing 252 includes an opening that faces a door of the probe chamber 210.

The upper air inlet 255 is located above the shower plate 251 and may extend through the housing 252 so that dry gas may be introduced into the chamber 254 via the upper air inlet 255. The dry gas may be an inert gas, dry air or a combination thereof. A single upper air inlet 255 is depicted in FIG. 2H. In some embodiments, two or more upper air inlets 255 are included in the environmental buffer 250. The dry gas may be delivered by one or more pipes or hoses attached to the upper air inlet(s) 255.

The air exhaust ports 257 are located in sidewalls near a bottom of the housing 252. This is beneficial to allow air flow to proceed from above the wafer 24 through the upper air inlet 255, through the shower plate 251, over the wafer 24 and out through the air exhaust ports 257. Two air exhaust ports 257 are depicted in FIG. 2H. In some embodiments, a single air exhaust port 257 is included instead of two, or more than two air exhaust ports 257 are included in the environmental buffer 250.

In some embodiments, a ratio of capacity of the upper air inlet 255 over capacity of the air exhaust port(s) 256 exceeds about 1.1. For example, flow of dry gas through the upper air inlet 255 may exceed about 300 liters per minute (LPM), which is beneficial for quickly carrying away moisture from the chamber 254.

The lift pins 256 are connected to a bottom wall of the housing 252 and are operable to provide placement and storage of the wafer 24, for example, during cooling thereof. In some embodiments, three lift pins 256 are included. Four or more lift pins 256 may also be included in the environmental buffer 250. Additional lift pins 256 may provide better stability during storage of the wafer 24, whereas fewer lift pins 256 may provide slightly better cooling of the wafer 24 due to greater exposure of the surface in contact therewith to the dry gas.

The shower plate 251 is positioned vertically between the air exhaust port(s) 256 and the upper air inlet 255, and is beneficial to spread or distribute flow of the dry gas before the dry gas reaches the wafer 24. By spreading or distributing the flow over a larger area via the shower plate 251, more of upper surface area of the wafer 24 may be contacted by the dry gas, which may improve dehumidification of the wafer 24. The shower plate 251 includes openings or holes 253.

As depicted in FIG. 2I and FIG. 2J, the holes 253 are arranged in and/or distributed over a horizontal plane (e.g., the XY plane). Seventy-seven holes 253 are depicted in FIGS. 2I and 2J, but fewer or more holes 253 may be included in the shower plate 251. In some embodiments, the shower plate 251 includes at least ten holes. Each of the holes may have diameter that exceeds about 10 millimeters. The holes 253 are depicted as being arranged in rows and columns and evenly distributed over area of the shower plate 251. In other embodiments, the shower plate 251 may include the holes 253 arranged in concentric circles, concentric rectangles, concentric triangles, random distributions, wavy rows and/or columns, combinations thereof or the like. Each of the holes 253 may extend completely through the shower plate 251 to allow the dry gas to pass through the holes 253 toward the wafer 24. As depicted in the plan view of FIG. 2J, the holes 253 may be arranged so that some of the holes 253 are entirely overlapped by the wafer 24, some of the holes 253 are partially overlapped by the wafer 24 and some of the holes are not overlapped by the wafer 24. In some embodiments, all of the holes 253 of the shower plate 251 overlap the wafer 24. In some embodiments, none of the holes does not overlap the wafer 24. The shower plate 251 is depicted as being larger than the wafer 24, and positioned such that the wafer 24 is entirely overlapped by the shower plate 251. In some embodiments, in the XY plane, the shower plate 251 is about the same size and shape as the wafer 24, exactly the same size and shape as the wafer or somewhat smaller in size than the wafer 24. For example, the shower plate 251 may be completely overlapped by the wafer 24 while the wafer 24 is not entirely overlapped by the shower plate 251.

A single shower plate 251 is depicted in FIGS. 2H-2J. In some embodiments, two or more shower plates 251 may be arranged in the chamber 254. For example, the two or more shower plates 251 may be stacked vertically above the wafer 24. Each of the two or more shower plates 251 may have the same configuration (e.g., XY dimensions, number of holes, arrangement of holes) as each other, or one or more of the two or more shower plates 251 may have configuration that differs from others of the two or more shower plates 251.

Figure 2K:
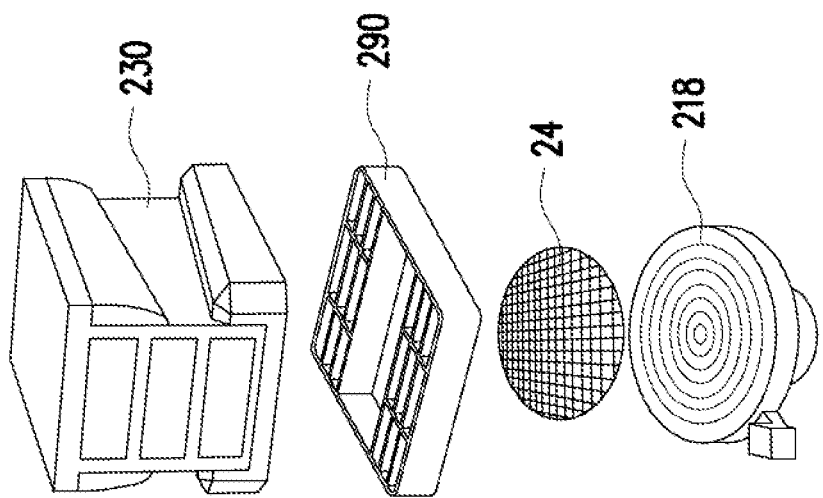

FIG. 2K is a partial perspective view depicting the test head 230, a probe card 290, the wafer 24 and the chuck 218. The wafer 24 may be positioned on the chuck 218. The chuck 218 may hold the wafer 24 in place to allow for precise positioning of probe pins of the probe card 290 on locations of the wafer 24 that are to be tested. The test head 230 is positioned over the wafer 24, and the probe card 290 is positioned between the wafer 24 and the test head 230. The test head 230 may transmit and receive signals to and from the wafer 24 via the probe card 290.

Figure 3:
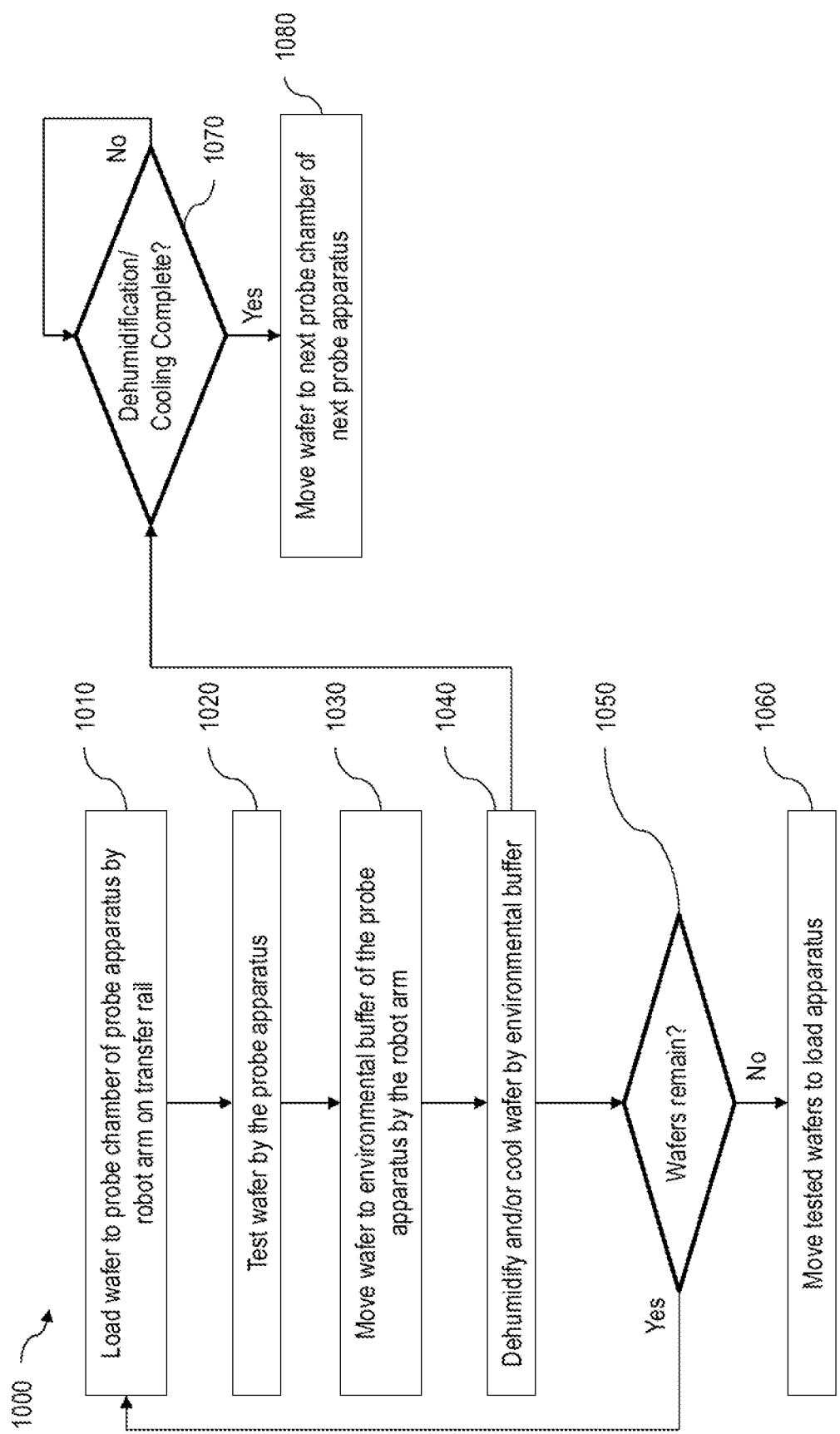
FIGS. 3 and 4 are flowcharts of methods according to various aspects of the present disclosure.
Figure 4:
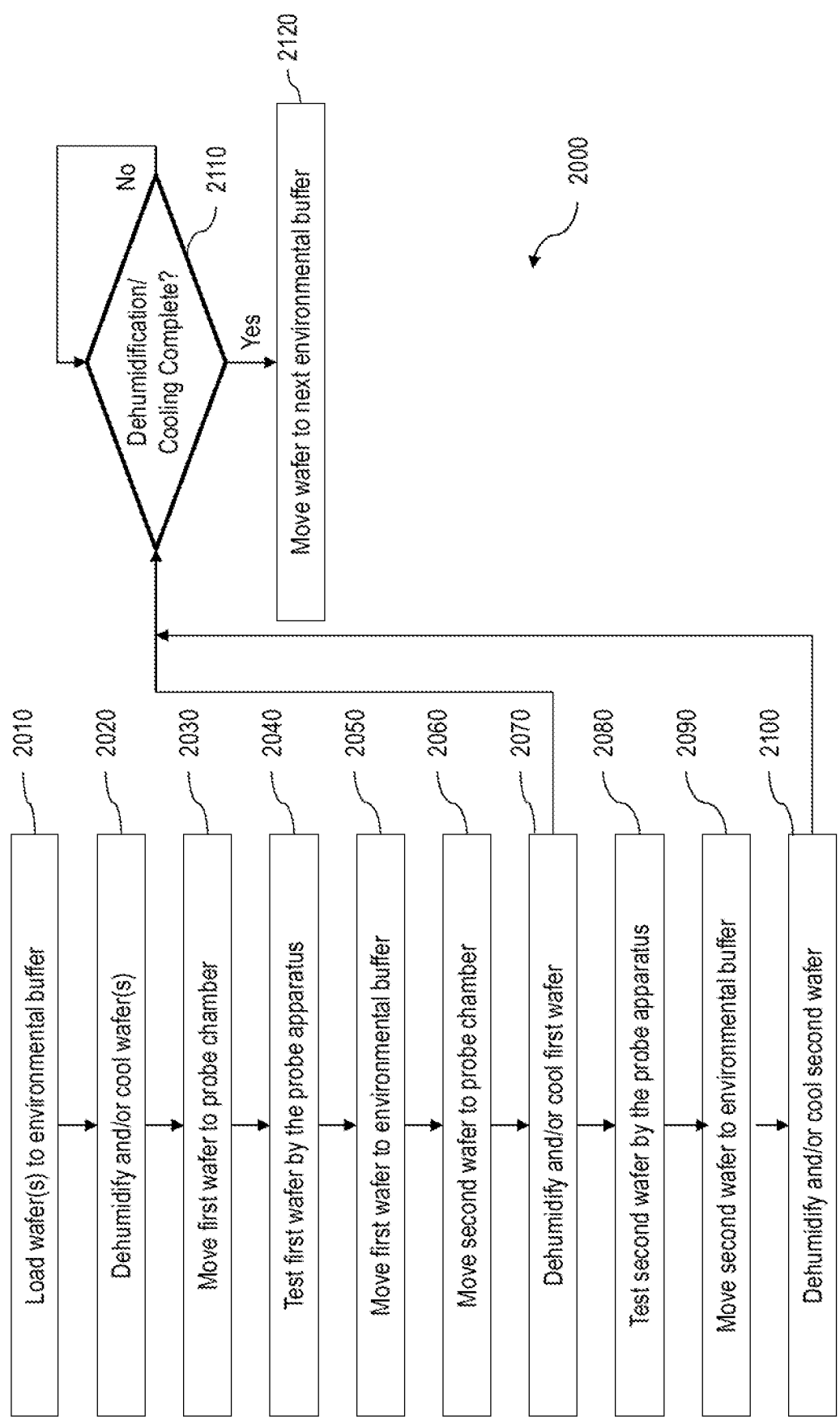

FIGS. 3 and 4 are flowcharts illustrating methods 1000, 2000 of testing a semiconductor device according to various aspects of the present disclosure. The various stages of testing of the IC device illustrated in FIGS. 3 and 4 may be performed in accordance with the system 10 described with reference to FIGS. 1A-2K. FIGS. 3 and 4 illustrates flowcharts of methods 1000, 2000 for testing an IC device or a portion thereof, according to one or more aspects of the present disclosure. Methods 1000, 2000 are examples and are not intended to limit the present disclosure to what is explicitly illustrated in methods 1000, 2000. Additional acts can be provided before, during and after the methods 1000, 2000 and some acts described can be replaced, eliminated, or moved around for additional embodiments of the methods. Not all acts are described herein in detail for reasons of simplicity. For example, acts related to fabrication of IC dies on a wafer prior to performing the acts depicted in the methods 1000, 2000 are omitted from view and not described in detail herein. Similarly, acts that follow the acts of methods 1000, 2000, for example, that are related to singulation and packaging of IC dies that pass the testing are also omitted from view and not described in detail herein. Acts of methods 1000, 2000 are described below with reference to elements of the system 10 of FIGS. 1A-2K. It should be understood that the methods 1000, 2000 are not limited to being performed by the system 10, and may be performed by systems that differ in one or more respects from the system 10 in other embodiments.

In FIG. 3, the method 1000 begins with act 1010, which is loading a wafer into a probe chamber of a probe apparatus by a robot arm on a transfer rail. For example, the wafer may be the wafer 24 or the wafer 14, the probe chamber may be the probe chamber 210 or the probe chamber 110, the probe apparatus may be the probe apparatus 200 or the probe apparatus 100A, the robot arm may be the robot arm 15 and the transfer rail may be the transfer rail 17. Prior to act 1010, the robot arm 15, which is located on the transfer rail 17, may retrieve the wafer 14, 24 from the load apparatus 16. The robot arm 15 may move the wafer 14, 24 forward and/or backward along the transfer rail 17, then may rotate the wafer 14, 24 toward the probe apparatus 200, and may extend to place the wafer 14, 24 in the probe chamber 210 of the probe apparatus 200. In some embodiments, as will be described with reference to FIG. 4, the wafer 14, 24 may be placed in an environmental buffer (e.g., the environmental buffer 150, 250) prior to being placed in the probe chamber 210.

Act 1020 follows act 1010. Following placing the wafer 14, 24 in the probe chamber 210, the wafer 14, 24 may be tested by the probe apparatus 100A, 200. The testing may include testing by the test head 130, 230 via the probe card 290. The testing may include parametric testing, functional testing, timing testing, power and/or voltage testing, memory testing, analog and/or mixed-signal testing, high-speed interface testing, burn-in testing, reliability and/or environmental testing, combinations thereof and the like. The testing may include heating the wafer 14, 24 in the probe chamber 210 to a selected temperature, after which the wafer 14, 24 may be probed and one or more of the tests just mentioned may be performed on the wafer 14, 24.

Act 1030 follows act 1020. Following testing the wafer 14, 24 by the probe apparatus 100A, 200, the wafer 14, 24 may be moved to the environmental buffer 150, 250 of the probe apparatus 100A, 200 by the robot arm 15. The robot arm 15 may pick the wafer 14, 24 from the probe chamber 110, 210, and may place the wafer 14, 24 on the standoffs 256 of the environmental buffer 150, 250.

Act 1040 follows act 1030. Following placing the wafer 14, 24 in the environmental buffer 150, 250, the wafer 14, 24 may be dehumidified and/or cooled by the environmental buffer 150, 250. For example, the wafer 24 may be cooled and dehumidified by the dry gas that enters the environmental buffer 250 via the upper air inlet 255.

Acts 1050 and 1070 follow act 1040. In act 1050, following or during the dehumidifying and/or cooling of the wafer 14, 24 by the environmental buffer 150, 250, a determination is made whether further wafers remain that are to be tested, for example, wafers that are positioned in the load apparatus 16. In response to the determination being that additional wafers do remain to be tested, the method 1000 may return from act 1050 to act 1010, in which one of the additional wafers may be picked from the load apparatus 16 and placed in the probe chamber 110, 210 of the probe apparatus 100A, 200 by the robot arm 15 on the transfer rail 17. In response to the determination being that no additional wafers remain to be tested, the method 1000 may proceed from act 1050 to act 1060, in which tested wafers may be removed from the system 10. For example, the wafers that have completed testing may be loaded into the load apparatus 16 by the robot arm 15, then may be loaded in a wafer carrier to be picked up by an OHT and transferred to another processing station or equipment. The wafers that have completed testing may be wafers that have also completed being cooled and/or dehumidified following the last respective test performed thereon.

Act 1070 follows act 1040. After the wafer 14, 24 is moved to the environmental buffer 150, 250 and dehumidification and/or cooling begins, a determination is made in act 1070 whether the dehumidification and/or cooling has completed. In some embodiments, the determination includes comparing time elapsed against a selected time threshold. For example, based on mass, material and temperature of the wafer 14, 24 following testing in the probe chamber 110, 210, a time threshold of one hour may be selected associated with time it will take to cool the wafer 14, 24 to room temperature. When the time elapsed exceeds the time threshold, the determination may be made in act 1070 that cooling and/or dehumidification of the wafer 14, 24 is complete. Prior to the time elapsed exceeding the time threshold, the determination may be made in act 1070 that the cooling and/or dehumidification is not complete. In another example, a thermometer or temperature probe may read temperature of the wafer 14, 24. When a temperature of the wafer 14, 24 read by the thermometer and/or temperature probe is at or below a selected temperature threshold (e.g., about room temperature), the determination may be made that cooling and/or dehumidification is complete. While the temperature exceeds the temperature threshold, the determination may be made that the cooling and/or dehumidification is incomplete. In response to the determination being that the cooling and/or dehumidification is incomplete, the method 1000 may return to act 1070. Act 1070 may be repeated periodically in intervals, such as every 1 second, 10 seconds, 1 minute, 10 minutes, another suitable interval, or the like.

Act 1080 follows act 1070. In act 1080, following the determination being made that the cooling and/or dehumidification is complete, the wafer 14, 24 may be moved to a second probe chamber 110, 210 of a second probe apparatus (e.g., the probe chamber 100B or another probe chamber 200). The second probe apparatus may be the probe chamber 100B depicted in FIGS. 1A-1D. Namely, the second probe apparatus 100B may be on an opposite side of the transfer rail 17 from the first probe apparatus 100A, may be on the same side of the transfer rail 17 as the first probe apparatus 100A, may be staggered relative to the first probe apparatus 100A or may be parallel relative to the first probe apparatus 100A. A testing environment (e.g., temperature) of the second probe apparatus 100B may be different than that of the first probe apparatus 100A. Similar operations to acts 1020, 1030 and 1040 may be performed after act 1080 to test the wafer 14, 24 in the second probe apparatus 100B, and are omitted from view in FIG. 3 for simplicity of illustration.

The method 1000 includes placing the wafer 14, 24 in the environmental buffer 150, 250 after unloading wafer out of the probe chamber 210, which is a beneficial timing for dehumidifying and cooling down the wafer 14, 24 to room temperature to avoid dew or condensation being generated on the wafer 14, 24. The method 2000 depicted in FIG. 4 includes an additional act of placing the wafer 14, 24 in the environmental buffer 150, 250 prior to testing the wafer 14, 24 in the probe apparatus 100A, 200, which is beneficial to maintain temperature and dryness of the wafer 14, 24 before the wafer 14, 24 is placed in the probe chamber 110, 210.

In FIG. 4, the method 2000 begins with act 2010, which includes loading one or more wafers into the environmental buffer 150, 250. The method 2000 is described and depicted in FIG. 4 for loading a first wafer and a second wafer into the environmental buffer 150, 250, but may also be used with slight modification for three or more wafers being loaded into the environmental buffer 150, 250. In act 2010, the wafers may be loaded one-at-a-time by the robot arm 15 into one or more environmental buffers 150, 250 that are attached to the probe chamber 110, 210 of a first probe apparatus 100A, 200. The wafers may be loaded by picking the wafers from the load apparatus 16 and placing the wafers in the environmental buffer(s) 150, 250.

Act 2020 follows act 2010. In act 2020, following loading the wafers into the environmental buffer(s) 150, 250, the wafers are dehumidified and/or cooled by the environmental buffer(s) 150, 250. Act 2020 may be similar in many respects to act 1040 described with reference to FIG. 3. Operation of the environmental buffer(s) 150, 250 is also described with reference to FIGS. 2H-2J.

Act 2030 follows act 2020. In act 2030, following dehumidifying and/or cooling the wafers, the first wafer is moved to the probe chamber 110, 210 of a first probe apparatus 100A, 200. Act 2030 is similar in many respects to act 1010 described with reference to FIG. 3. The robot arm 15 may pick the first wafer in the environmental buffer 150, 250 and place the first wafer in the probe chamber 110, 210. The second wafer may remain in the environmental buffer 150, 250 while the first wafer is in the probe chamber 110, 210.

Act 2040 follows act 2030. In act 2040, following moving the first wafer to the probe chamber 110, 210, the first wafer is tested by the first probe apparatus. Act 2040 is similar in many respects to act 1020 described with reference to FIG. 3.

Act 2050 follows act 2040. In act 2050, following testing the first wafer by the first probe apparatus, the first wafer is moved to the environmental buffer 150, 250. Act 2050 is similar in many respects to act 1030 described with reference to FIG. 3.

Act 2060 follows act 2050. In act 2060, following moving the first wafer to the environmental buffer 150, 250, the second wafer is moved from the environmental buffer 150, 250 to the probe chamber of the first probe apparatus (e.g., the probe chamber 110, 210 of the first probe apparatus 100A).

Act 2070 follows act 2060. In act 2070, following or simultaneously with moving the second wafer to the probe chamber, the first wafer is dehumidified and/or cooled in the environmental buffer 150, 250. For example, the first wafer may be placed in a first environmental buffer and the second wafer may be positioned in a second environmental buffer that is separate and different from the first environmental buffer. As such, after removing the first wafer from the probe chamber and placing the first wafer in the first environmental buffer, the first environmental buffer may immediately begin cooling and/or dehydrating the first wafer. While the cooling and/or dehydrating is occurring, the second wafer may be moved from the second environmental buffer into the probe chamber. In another example, a single environmental buffer may have capacity to hold two or more wafers in the chamber thereof. In this example, the single environmental buffer may remain open to an external environment until the second wafer has been transferred to the probe chamber, after which the single environmental buffer having the first wafer therein may be closed off and dehumidification and/or cooling of the first wafer may begin.

Act 2080 follows act 2060 and optionally follows act 2070. In act 2080, following moving the second wafer to the probe chamber of the first probe apparatus, the second wafer is tested by the first probe apparatus. Act 2080 is similar in many respects to acts 2040 and 1020 described previously. Generally, the testing of the second wafer in the first probe apparatus uses the same test conditions (e.g., temperature, time, test patterns, test types and the like) that were used to test the first wafer. In some embodiments, the test of the second wafer by the first probe apparatus is different in one or more aspects from the test of the first wafer.

Act 2090 follows act 2080. In act 2090, following testing the second wafer by the first probe apparatus, the second wafer is moved to the environmental buffer. Act 2090 may be similar in many respects to acts 2050 and 1030 described previously. The second wafer may be moved to the same environmental buffer as the first wafer or may be moved to a different, separated environmental buffer than that in which the first wafer is positioned.

Act 2100 follows act 2090. In act 2100, following moving the second wafer to the environmental buffer, the second wafer is dehumidified and/or cooled in and by the environmental buffer. Act 2100 may be similar in many respects to acts 2070 and 1040. When the second wafer and the first wafer are positioned in the same environmental buffer, the second wafer and the first wafer may be cooled and/or dehumidified by the same dry gas that flows in the environmental buffer as described with reference to FIGS. 2H-2J.

Act 2110 follows either or both of acts 2070 and 2100. In act 2110, following the dehumidification and/or cooling of the first and/or second wafers beginning, a determination is made whether the dehumidification and/or cooling is complete. Act 2110 may be similar in many respects to act 1070 described with reference to FIG. 3.

Act 2120 follows act 2110. In act 2120, following determination being made that the dehumidification and/or cooling of the first wafer or second wafer is complete, the first wafer or second wafer may be moved to the next environmental buffer (e.g., the environmental buffer of the second probe apparatus 100B that follows the first probe apparatus 100A). In the example of the first wafer and the second wafer that has been described herein, the first wafer having completed being tested earlier may cool to room temperature earlier than the second wafer, and so the first wafer may be transferred to the environmental buffer of the second probe apparatus 100B prior to the second wafer being transferred thereto. Other acts related to testing the first wafer, for example, in the second probe apparatus 100B may be similar to acts 2010-2040 and are omitted from view in the method 2000 of FIG. 4. Further acts may also be included to test the first and second wafers by additional probe apparatuses (e.g., the probe apparatuses 100C, 100D) following the second probe apparatus.

Embodiments may provide advantages. Multiple probe apparatuses 100A-100D, 200 are arranged in a staggered or parallel manner along a transfer rail 17. The wafer 14, 24 is loaded into each probe chamber 110, 210 from the backside of the respective probe apparatus 100A, 200. Each probe apparatus chamber may have a temperature and humidity buffer 150, 250 attached thereto. The transfer rail 17 and robot arm 15 are beneficial to integrate multiple probe apparatuses 100A-100D, 200 in one system 10. A load apparatus 16 is added adjacent the transfer rail 17 and load apparatuses may be omitted from the respective probe apparatuses 100A-100D, 200. As such, footprint of the system 10 may be reduced by up to or exceeding 13% compared to systems that include load apparatuses in each probe apparatus. Transfer cycle time is also reduced, which is beneficial to improve productivity. Dew and moisture are removed from the wafer 14, 24 by the temperature and humidity buffer 150, 250, which improves testing results.

In accordance with at least one embodiment, a method includes: positioning a wafer in a first probe chamber of a first probe apparatus by a robot arm, the first probe apparatus being adjacent a transfer rail, the robot arm, in operation, moving along the transfer rail; testing the wafer by the first probe apparatus; following the testing, transferring the wafer to an environmental buffer attached to the first probe chamber; cooling the wafer in the environmental buffer; and following the cooling, transferring the wafer from the environmental buffer to a second probe chamber of a second probe apparatus by the robot arm, the second probe apparatus being adjacent the transfer rail and offset from the first probe apparatus.

In accordance with at least one embodiment, a method includes: positioning a wafer in a first environmental buffer attached to a first probe chamber of a first probe apparatus by a robot arm, the first probe apparatus being adjacent a transfer rail, the robot arm, in operation, moving along the transfer rail; dehumidifying the wafer by the first environmental buffer; following the dehumidifying, transferring the wafer from the first environmental buffer to the first probe chamber; testing the wafer by the first probe apparatus; following the testing, transferring the wafer to the first environmental buffer; cooling the wafer in the first environmental buffer; and following the cooling, transferring the wafer from the first environmental buffer to a second environmental buffer by the robot arm, the second environmental buffer being attached to a second probe chamber of a second probe apparatus, the second probe apparatus being adjacent the transfer rail and offset from the first probe apparatus.

In accordance with at least one embodiment, a system includes: a transfer rail; a robot arm on the transfer rail, the robot arm being operable to move forward and backward along the transfer rail; a load apparatus adjacent an end of the transfer rail; a first probe apparatus adjacent a first side of the transfer rail, the first probe apparatus including a first opening that faces the transfer rail and is opposite a first probe door of the first probe apparatus; and a second probe apparatus adjacent the transfer rail and offset from the first probe apparatus, the second probe apparatus including a second opening that faces the transfer rail and is opposite a second probe door of the second probe apparatus.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    positioning a wafer in a first probe chamber of a first probe apparatus by a robot arm, the first probe apparatus being adjacent a transfer rail, the robot arm, in operation, moving along the transfer rail;
    testing the wafer by the first probe apparatus;
    following the testing, transferring the wafer to an environmental buffer attached to the first probe chamber;
    cooling the wafer in the environmental buffer; and
    following the cooling, transferring the wafer from the environmental buffer to a second probe chamber of a second probe apparatus by the robot arm, the second probe apparatus being adjacent the transfer rail and offset from the first probe apparatus.

2. The method of claim 1, wherein the positioning a wafer includes placing the wafer by the robot arm through an opening in a backside of the first probe chamber that is on a side of the first probe chamber opposite that of a probe door of the first probe chamber.

3. The method of claim 1, wherein the transferring the wafer includes transferring the wafer to the second probe chamber of the second probe apparatus that is across the transfer rail from the first probe apparatus.

4. The method of claim 1, wherein the transferring the wafer includes transferring the wafer to the second probe chamber of the second probe apparatus that is across the transfer rail from the first probe apparatus, the second probe chamber overlapping the first probe chamber.

5. The method of claim 1, wherein the transferring the wafer includes transferring the wafer to the second probe chamber of the second probe apparatus that is on a same side of the transfer rail as the first probe apparatus.

6. The method of claim 1, further comprising:
    prior to the positioning a wafer in a first probe chamber, retrieving the wafer from a load apparatus, the load apparatus being at an end of the transfer rail.

7. The method of claim 1, further comprising:
    during the cooling the wafer in environmental buffer, positioning a second wafer in the first probe chamber.

8. A method, comprising:
    positioning a wafer in a first environmental buffer attached to a first probe chamber of a first probe apparatus by a robot arm, the first probe apparatus being adjacent a transfer rail, the robot arm, in operation, moving along the transfer rail;
    dehumidifying the wafer by the first environmental buffer;
    following the dehumidifying, transferring the wafer from the first environmental buffer to the first probe chamber;
    testing the wafer by the first probe apparatus;
    following the testing, transferring the wafer to the first environmental buffer;
    cooling the wafer in the first environmental buffer; and
    following the cooling, transferring the wafer from the first environmental buffer to a second environmental buffer by the robot arm, the second environmental buffer being attached to a second probe chamber of a second probe apparatus, the second probe apparatus being adjacent the transfer rail and offset from the first probe apparatus.

9. The method of claim 8, wherein the dehumidifying the wafer includes flowing dry gas into the first environmental buffer and across a surface of the wafer in the first environmental buffer.

10. The method of claim 9, wherein the flowing a dry gas includes flowing the dry gas into the first environmental buffer through an upper air inlet and out of the first environmental buffer by air exhaust port.

11. The method of claim 10, wherein the flowing the dry gas includes flowing the dry gas through a shower plate disposed between the upper air inlet and the air exhaust port.

12. The method of claim 11, wherein the flowing the dry gas includes flowing the dry gas through the upper air inlet and the air exhaust port having a ratio of capacity of the upper air inlet over capacity of the air exhaust port that exceeds about 1.1.

13. The method of claim 11, wherein the flowing the dry gas includes flowing the dry gas through the upper air inlet at a rate that exceeds about 300 liters per minute.

14. The method of claim 8, wherein the dehumidifying the wafer includes dehumidifying the wafer by the first environmental buffer having dew point less than about-50 degrees Celsius.

15. A system, comprising:
    a transfer rail;
    a robot arm on the transfer rail, the robot arm being operable to move forward and backward along the transfer rail;
    a load apparatus adjacent an end of the transfer rail;
    a first probe apparatus adjacent a first side of the transfer rail, the first probe apparatus including a first opening that faces the transfer rail and is opposite a first probe door of the first probe apparatus; and
    a second probe apparatus adjacent the transfer rail and offset from the first probe apparatus, the second probe apparatus including a second opening that faces the transfer rail and is opposite a second probe door of the second probe apparatus.

16. The system of claim 15, wherein the robot arm, in operation:
    positions a wafer in a first probe chamber of the first probe apparatus;
    transfers the wafer to a first environmental buffer attached to the first probe chamber; and
    transfers the wafer from the first environmental buffer to a second probe chamber of the second probe apparatus.

17. The system of claim 15, wherein the second probe apparatus is adjacent a second side of the transfer rail opposite the first side.

18. The system of claim 17, wherein the first opening overlaps the second opening.

19. The system of claim 15, wherein the first probe apparatus comprises:
    a probe chamber;
    the first probe door attached to a first side of the probe chamber;
    a test head;
    a manipulator that, in operation, positions the test head over the probe chamber; and
    an environmental buffer attached to a second side of the probe chamber that is opposite the first side of the probe chamber.

20. The system of claim 19, wherein the environmental buffer includes:

a housing;
a chamber in the housing;
an upper air inlet in the housing;
an air exhaust port in the housing; and
a shower plate positioned between the upper air inlet and the air exhaust port.

\* \* \* \* \*